(12) United States Patent
Chen et al.

(10) Patent No.: US 12,211,823 B2
(45) Date of Patent: Jan. 28, 2025

(54) SEMICONDUCTOR PACKAGE WITH SHARED BARRIER LAYER IN REDISTRIBUTION AND VIA AND METHOD OF MANUFACTURING THE SAME

(71) Applicant: Taiwan Semiconductor Manufacturing Company, Ltd., Hsinchu (TW)

(72) Inventors: Hsien-Wei Chen, Hsinchu (TW); Ching-Jung Yang, Taoyuan (TW); Ming-Fa Chen, Taichung (TW); Sung-Feng Yeh, Taipei (TW); Ying-Ju Chen, Yunlin County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 170 days.

(21) Appl. No.: 17/739,215

(22) Filed: May 9, 2022

(65) Prior Publication Data
US 2022/0262772 A1    Aug. 18, 2022

Related U.S. Application Data

(63) Continuation of application No. 16/737,856, filed on Jan. 8, 2020, now Pat. No. 11,362,064.
(Continued)

(51) Int. Cl.
*H01L 21/768* (2006.01)
*H01L 21/48* (2006.01)
(Continued)

(52) U.S. Cl.
CPC .... *H01L 25/0657* (2013.01); *H01L 21/76807* (2013.01); *H01L 21/76877* (2013.01);
(Continued)

(58) Field of Classification Search
CPC .......... H01L 25/0657; H01L 21/76807; H01L 21/76877; H01L 25/50; H01L 24/05; H01L 2224/02372
See application file for complete search history.

(56) References Cited

U.S. PATENT DOCUMENTS

| 6,037,664 | A | * | 3/2000 | Zhao | H01L 23/5226 257/762 |
| 2015/0137323 | A1 | * | 5/2015 | Zhou | H01L 21/76898 257/621 |
| 2018/0005940 | A1 | * | 1/2018 | Chen | H01L 25/0657 |

* cited by examiner

*Primary Examiner* — Antonio B Crite
*Assistant Examiner* — Tenley H Schofield
(74) *Attorney, Agent, or Firm* — JCIPRNET

(57) ABSTRACT

A package structure includes first and second dies, an insulation structure, a through via, a dielectric layer and a redistribution layer. The second die electrically bonded to the first die includes a through substrate via. The insulation structure is disposed on the first die and laterally surrounds the second die. The through via penetrates through the insulation structure to electrically connect to the first die. The dielectric layer is disposed on the second die and the insulation structure. The redistribution layer is embedded in the dielectric layer and electrically connected to the through via. The redistribution layer includes a first barrier layer and a conductive layer on the first barrier layer. The through substrate via is electrically connected to the redistribution layer, and the conductive layer is in contact with a conductive post of the through via and separated from the through substrate via by the first barrier layer therebetween.

20 Claims, 10 Drawing Sheets

Related U.S. Application Data

(60) Provisional application No. 62/907,560, filed on Sep. 28, 2019.

(51) Int. Cl.
*H01L 21/56* (2006.01)
*H01L 21/66* (2006.01)
*H01L 21/68* (2006.01)
*H01L 23/00* (2006.01)
*H01L 23/31* (2006.01)
*H01L 23/495* (2006.01)
*H01L 23/498* (2006.01)
*H01L 23/522* (2006.01)
*H01L 23/528* (2006.01)
*H01L 23/532* (2006.01)
*H01L 25/00* (2006.01)
*H01L 25/065* (2023.01)
*H01L 27/088* (2006.01)
*H10B 41/27* (2023.01)
*H10B 43/27* (2023.01)

(52) U.S. Cl.
CPC .............. *H01L 25/50* (2013.01); *H01L 24/05* (2013.01); *H01L 2224/02372* (2013.01)

SEMICONDUCTOR PACKAGE WITH SHARED BARRIER LAYER IN REDISTRIBUTION AND VIA AND METHOD OF MANUFACTURING THE SAME

CROSS-REFERENCE TO RELATED APPLICATION

This application is a continuation application of and claims the priority benefit of a prior application Ser. No. 16/737,856, filed on Jan. 8, 2020 and now allowed, which claims the priority benefit of U.S. provisional application Ser. No. 62/907,560, filed on Sep. 28, 2019. The entirety of the above-mentioned patent applications is hereby incorporated by reference herein and made a part of this specification.

BACKGROUND

The packages of integrated circuits are becoming increasing complex, with more device dies packaged in the same package to achieve more functions. For example, System on Integrate Chip (SoIC) has been developed to include a plurality of device dies such as processors and memory cubes in the same package. The SoIC can include device dies formed using different technologies and have different functions bonded to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
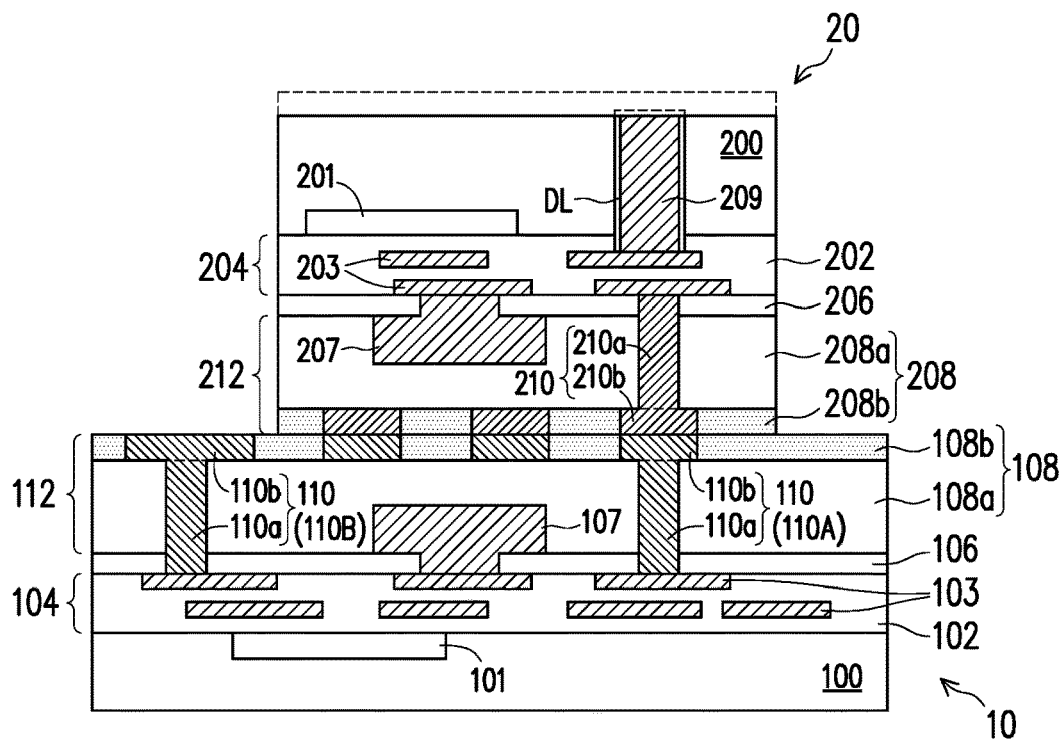
FIG. 1A to FIG. 1L are schematic cross-sectional views illustrating a method of manufacturing a package structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A package structure and the method of forming the same are provided in accordance with various embodiments. In some embodiments, the package structure is a System on Integrated Chip (SoIC) package. The intermediate stages of forming the SoIC package are illustrated in accordance with some embodiments. Throughout the various views and illustrative embodiments, like reference numbers are used to designate like elements. It is appreciated that although the formation of SoIC packages is used as examples to explain the concept of the embodiments of the present disclosure, the embodiments of the present disclosure are readily applicable to other package structures and packaging methods in which redistribution layer is connected to through vias.

FIG. 1A to FIG. 1L are schematic cross-sectional views illustrating a method of forming a package structure according to some embodiments of the disclosure.

Referring to FIG. 1A, in some embodiments, a die 20 is electrically bonded to a die 10. The die 20 and the die 10 may respectively be an application-specific integrated circuit (ASIC) chip, an System on Chip (SoC), an analog chip, a sensor chip, a wireless and radio frequency chip, a voltage regulator chip, a logic die such as a Central Processing Unit (CPU) die, a Micro Control Unit (MCU) die, a BaseBand (BB) die, an Application processor (AP) die, or a memory chip such as a Dynamic Random Access Memory (DRAM) die or a Static Random Access Memory (SRAM) die, or the like, other types of die, for example. The die 20 and the die 10 may be the same types of dies or different types of dies, and the types of the dies are not limited in the disclosure. Various suitable bonding techniques may be applied for the bonding of the die 20 to the die 10. For example, the die 20 may be bonded to the die 10 through hybrid bonding, fusion bonding, or the like, or combinations thereof. Although one die 10 and one die 20 are shown in the figures, the number of the dies 10 and 20 are not limited in the disclosure.

The die 10 may be a chip included in a semiconductor wafer in the present stage. Although one die 10 is shown, it is understood that the semiconductor wafer includes a plurality of dies 10 each of which locates within a die region of the wafer and spaced from each other by scribe regions. The singulation of the dies 10 may be performed in subsequent processes (FIG. 1L). The die 20 may be a die which have been singulated from another semiconductor wafer and mounted on the die through pick-and-place processes. In some embodiments, the die 10 and the die 20 have similar structures, and the detailed structure of the dies will be described below taken the die 10 as an example.

In some embodiments, the die 10 includes a substrate 100, devices 101, an interconnection structure 104, a passivation layer 106, pad(s) 107 and a bonding structure 112. In some embodiments, the substrate 100 is a semiconductor substrate made of silicon and/or other semiconductor materials. Alternatively or additionally, the substrate 100 includes other elementary semiconductor materials such as germanium, gallium arsenic, or other suitable semiconductor materials. In some embodiments, the substrate 100 may further include other features such as various doped regions, buried layer(s), and/or epitaxy layer(s). Moreover, in some embodiments, the substrate 100 is made of an alloy semiconductor such as silicon germanium, silicon germanium carbide, gallium arsenic phosphide, or gallium indium phosphide. Furthermore, the substrate 100 may be a semiconductor on insulator such as silicon on insulator (SOI) or silicon on sapphire.

In some embodiments, a plurality of devices 101 are formed in and/or on the substrate 100. The devices 101 may also be referred to as integrated circuit devices. In some embodiments, the devices 101 include active devices, passive devices, or combinations thereof. The devices 101 may include, for example, transistors, capacitors, resistors, diodes, photodiodes, fuse devices, or the like, or combinations thereof. The details of the devices 101 are not illustrated herein for the sake of brevity.

The interconnection structure 104 is formed on the substrate 100 to electrically connect the various devices 101 to form a functional circuit. The interconnection structure 104 may include a metallization structure (conductive structure) 103 embedded in a dielectric structure 102. The dielectric structure 102 may include a plurality of dielectric layers, such as inter-layer dielectric layers (ILDs) and inter-metal dielectric layers (IMDs). In some embodiments, the dielectric structure 102 is an inorganic dielectric structure. Additionally or alternatively, the dielectric structure 102 may include organic dielectric material. For example, the material of the dielectric structure 102 may include silicon oxide, silicon nitride, silicon oxynitride, silicon carbide, low-K dielectric material, such as un-doped silicate glass (USG), phosphosilicate glass (PSG), boron-doped phosphosilicate glass (BPSG), fluorinated silica glass (FSG), SiOxCy, Spin-On-Glass, Spin-On-Polymers, silicon carbon material, compounds thereof, composites thereof, combinations thereof, or the like.

The metallization structure 103 includes a plurality of conductive features interconnected to each other and embedded in the dielectric structure 102. The conductive features may include multi-layers of conductive lines, conductive vias, and conductive contacts. The conductive contacts may be formed in the ILDs to electrically connect the conductive lines to the devices 101; the conductive vias may be formed in the IMDs to electrically connect the conductive lines in different layers. The conductive features of the metallization structure 103 may include metal, metal alloy or a combination thereof. For example, the conductive features may include tungsten (W), copper (Cu), copper alloys, aluminum (Al), aluminum alloys, or combinations thereof. In some embodiments, the topmost conductive features of the metallization structure 103 have top surfaces substantially coplanar with a top surface of the dielectric structure 102, but the disclosure is not limited thereto.

In some embodiments, the passivation layer 106 is formed on the interconnection structure 104 to cover the dielectric structure 102 and the metallization structure 103. The passivation layer 106 may include a dielectric material such as silicon oxide, silicon nitride, silicon oxynitride, or combinations thereof. In an embodiment, the material of the passivation layer 106 is different from an underlying dielectric layer of the dielectric structure 102. For example, the topmost dielectric layer of the dielectric structure 102 includes silicon oxide, while the passivation layer 106 includes silicon nitride. However, the disclosure is not limited thereto.

The pad 107 is formed on and penetrating through the passivation layer 106 to electrically connect to a top conductive feature of the interconnection structure 104, and further electrically connected to the devices 101 through the interconnection structure 104. The pad 107 includes conductive materials such as metal or metal alloy, such as aluminum, copper, nickel, or alloys thereof. In an embodiment, the pad 107 is an aluminum pad. In some embodiments, the pad 107 includes a via portion embedded in and penetrating through the passivation layer 106 to be in electrical and physical contact with the topmost conductive feature of the interconnection structure 104, and a protruding portion on the via portion and the passivation layer 106. Although one pad 107 is illustrated in the figures, the die 10 may include a plurality of pads 107, and the number of the pads 107 is not limited in the disclosure.

In some embodiments, the bonding structure 112 is formed over the interconnection structure 104, the pads 107 and the passivation layer 106 and connected to the metallization structure 103 and/or the pad 107. The bonding structure 112 may include a dielectric structure 108 and a plurality of bonding conductors 110 embedded in the dielectric structure 108. The dielectric structure 108 may include oxide such as silicon oxide, nitride such as silicon nitride, oxynitride such as silicon oxynitride, undoped silicate glass (USG), tetraethyl orthosilicate (TEOS), or a combination thereof. The material of the dielectric structure 108 may be the same as or different from the material of the passivation layer 106. The dielectric structure 108 may be formed by a suitable process such as spin coating, chemical vapor deposition (CVD) or the like. The bonding conductor 110 may be formed of aluminum, copper, nickel, gold, silver, tungsten, or combinations thereof and formed by single damascene process(es) or dual-damascene process.

In some embodiments, the dielectric structure 108 covers the sidewalls and top surfaces of the pads 107, and the top surface of the passivation layer 106. The dielectric structure 108 may include a single layer or multiple layers. In some embodiments, the dielectric structure 108 has a multi-layer structure including a first dielectric layer 108a and a second dielectric layer 108b on the first dielectric layer 108a. The materials of the first dielectric layer 108a and the second dielectric layer 108b may be the same or different. In some embodiments, both of the first dielectric layer 108a and the second dielectric layer 108b include oxide such as silicon oxide. In some embodiments, the thickness of the first dielectric layer 108a is larger than the thickness of the second dielectric layer 108b. In some other embodiments, more than two dielectric layers may be included in the dielectric structure 108, and the number of the layers of the dielectric layers is not limited in the disclosure.

In some embodiments, the bonding conductors 110 penetrate through the dielectric structure 108 and the passivation layer 106 to be in electrical and physical contact with the metallization structure 130 of the interconnection structure 104. In an embodiment, the bonding conductors 110 are landing on a topmost conductive feature of the metallization structure 130, but the disclosure is not limited thereto. In alternative embodiments, some or all of the bonding conductors 110 may land on the pads 107. In other words, the bonding conductors 110 may land on the metallization structure 130 (such as topmost conductive feature thereof), the pads 107 or combinations thereof.

In some embodiments, the bonding conductor 110 includes a conductive via 110a and a bonding pad 110b electrically connected to each other. In the embodiment in which the bonding conductor 110 is formed by dual-damascene process, the conductive via 110a and the bonding pad 110b are simultaneously formed and there is free of interface therebetween. In alternative embodiments in which the bonding conductor 110 is formed by single damascene process, the conductive via 110a and the bonding pad 110b are separately formed and an interface may be existed therebetween. The materials of the conductive via 110a and the bonding pad 110b may be the same or different. The cross-section shapes of the conductive via 110a and the bonding pad 110b may respectively be square, rectangle, trapezoid, or the like. The sidewalls of the conductive via 110a and the bonding pad 110b may respectively be straight or inclined, but the disclosure is not limited thereto. The cross-section shape of the bonding conductor 110 may be T-shaped or the like.

In some embodiments in which the bonding conductor 110 lands on topmost conductive feature of the metallization structure 103, the conductive via 110a is embedded in and penetrating through the first dielectric layer 108a and the passivation layer 106 to connect to the topmost conductive feature. In alternative embodiments in which the bonding conductor 110 lands on the pad 107, the conductive via 110a would be embedded in the dielectric layer 108a without penetrating through the passivation layer 106.

The bonding pad 110b is embedded in the second dielectric layer 108b and in physical and electrical contact with the conductive via 110a. In some embodiments, the top surfaces of the bonding pads 110b are substantially coplanar with the top surface of the dielectric layer 108b.

In some embodiments, the bonding conductors 110 include bonding conductor(s) 110A used for bonding to the die 20 and bonding conductor(s) 110B used for through via landing in subsequent process.

Still referring to FIG. 1A, in some embodiments, the die 20 includes a structure similar to the die 10. For example, the die 20 includes a substrate 200, devices 201, an interconnection structure 204 including a metallization structure 203 embedded in a dielectric structure 202, a passivation layer 206, pad(s) 207, and a bonding structure 212 including bonding conductors 210 embedded in a dielectric structure 208. In some embodiments, the dielectric structure 208 includes a first dielectric layer 208a and a second dielectric layer 208b, the bonding conductor 210 includes a conductive via 210a and a bonding pad 210b. The materials and configurations of the substrate 200, the devices 201, the interconnection structure 204, the passivation layer 206, the pad(s) 207, and the bonding structure 212 of the die 20 may be substantially similar to those described above regarding the die 10, which are not described again here.

In some embodiments, the die 20 further includes conductive via(s) 209 formed in the substrate 102 and electrically connected to the interconnection structure 204. The conductive vias 209 may extend into the interconnection structure 204 to be in physical and electrical contact with the conductive features of the interconnection structure 204. In some embodiments, the conductive via 209 includes liner(s) DL covering surface thereof. The liner DL is disposed between conductive via 209 and the substrate 200 to separate the conductive via 209 from the substrate 102. The liner DL may surround the sidewalls and/or top surface of the conductive via 209. The conductive via 209 may include copper, copper alloys, aluminum, aluminum alloys, Ta, TaN, Ti, TiN, CoW or combinations thereof. The liner DL may include dielectric material, such as silicon oxide, silicon nitride, silicon oxynitride or the like, or combinations thereof.

In some embodiments, the die 20 is bonded to the die 10 through a hybrid bonding process, and the hybrid bonding involves at least two types of bonding, including metal-to-metal bonding and non-metal-to-non-metal bonding such as dielectric-to-dielectric bonding, for example. In some embodiments, the bonding pads 210b of the die 20 are bonded to the bonding pads 110b of the die 10 through metal-to-metal bonding, while the dielectric layer 208b of the die 20 is bonded to the dielectric layer 108b of the die 10 through dielectric-to-dielectric bonding. In some embodiments, the bonding process may be performed as below: first, to avoid the occurrence of the unbonded areas (i.e. interface bubbles), the to-be-bonded surfaces of the die 20 and the die 10 (that is, the surfaces of the bonding structures 208 and 108) are processed to be sufficiently clean and smooth. Then, the die 20 is picked-and-placed on the die 10, the die 20 and the die 10 are aligned and placed in physical contact at room temperature with slight pressure to initiate a bonding operation. Thereafter, a thermal treatment such as an annealing process at elevated temperatures is performed to strengthen the chemical bonds between the to-be-bonded surfaces of the die 20 and the die 10 and to transform the chemical bonds into covalent bonds.

In other words, a bonding interface is existed the bonding structure 108 of the die 10 and the bonding structure 208 of the die 20. In some embodiments, the bonding interface is a hybrid bonding interface including a metal-to-metal bonding interface between the bonding pads 210b and the bonding pads 110b and a dielectric-to-dielectric bonding interface between the dielectric layer 208b and the dielectric layer 108b.

In some embodiments, the die 20 is bonded to the die 10 in a face-to-face configuration. That is, the front surface of the die 20 faces the front surface of the die 10. However, the disclosure is not limited thereto. In alternative embodiments, the die 20 may be bonded to the die 10 in a face-to-back configuration, or a back-to-back configuration. In other words, the front surface of the one of the dies 10 and 20 may face the back surface of the other one of the dies 10 and 20, or the back surface of the die 20 may face the back surface of the die 10. Throughout the specification, a "front surface" of a die refers to a surface close to pads, and may also be referred to as an active surface; a "back surface" of a die is a surface opposite to the front surface and may be a surface of the substrate, which may also be referred to as a rear surface.

In some embodiments, after the die 20 is bonded to the die 10, a backside grinding process may be performed to thin the die 20, and the conductive vias 209 may be revealed after the backside grinding process. As shown in FIG. 1A, in some embodiments, the conductive vias 209 may extend through the substrate 200 and be revealed from the top surface (i.e. back surface) of the die 20, the top surfaces of the conductive via 209 and the liner DL may be substantially coplanar with the top surface (i.e. back surface) of the substrate 200. In such embodiment, the conductive via 209 may also be referred to as a through substrate via (TSV). However, the disclosure is not limited thereto. In some other embodiments, the conductive vias 209 are not revealed at this time, and the backside grinding is stopped when there is a thin layer of substrate 200 covering the conductive via 209 (shown as the dashed line). In yet another embodiment, the backside grinding process may be skipped. In some embodiments, the conductive vias 209 may be revealed in the step shown in FIG. 1C.

Figure 1B:
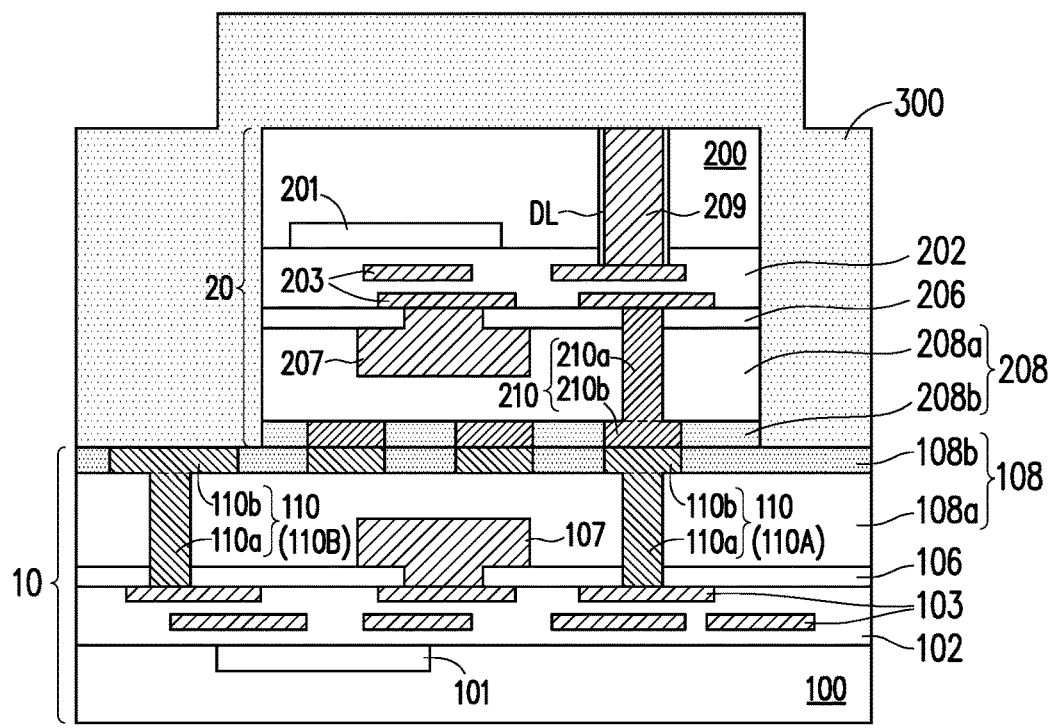

Referring to FIG. 1B, a dielectric material layer 300 is formed on the die 10 to cover sidewalls and top surface of the die 20. In some embodiments, the dielectric material layer 300 includes silicon oxide, or TEOS, while other dielectric materials such as silicon carbide, silicon oxynitride, silicon oxy-carbo-nitride, PSG, BSG, BPSG, or the like may also be used. The dielectric material layer 300 may be formed using CVD, High-Density Plasma Chemical Vapor Deposition (HDPCVD), Flowable CVD, spin-on coating, or the like. In alternative embodiments, the dielectric material layer 300 may include a molding compound, a molding underfill, a resin such as epoxy, a combination thereof, or the like, and the dielectric material layer 300 may be formed by a molding process, a molding underfilling (MUF) process, or the like. In the embodiments in which the dielectric material layer 300 formed by molding process, the dielectric material layer 300 may have a substantially flat top surface (not shown).

Figure 1C:
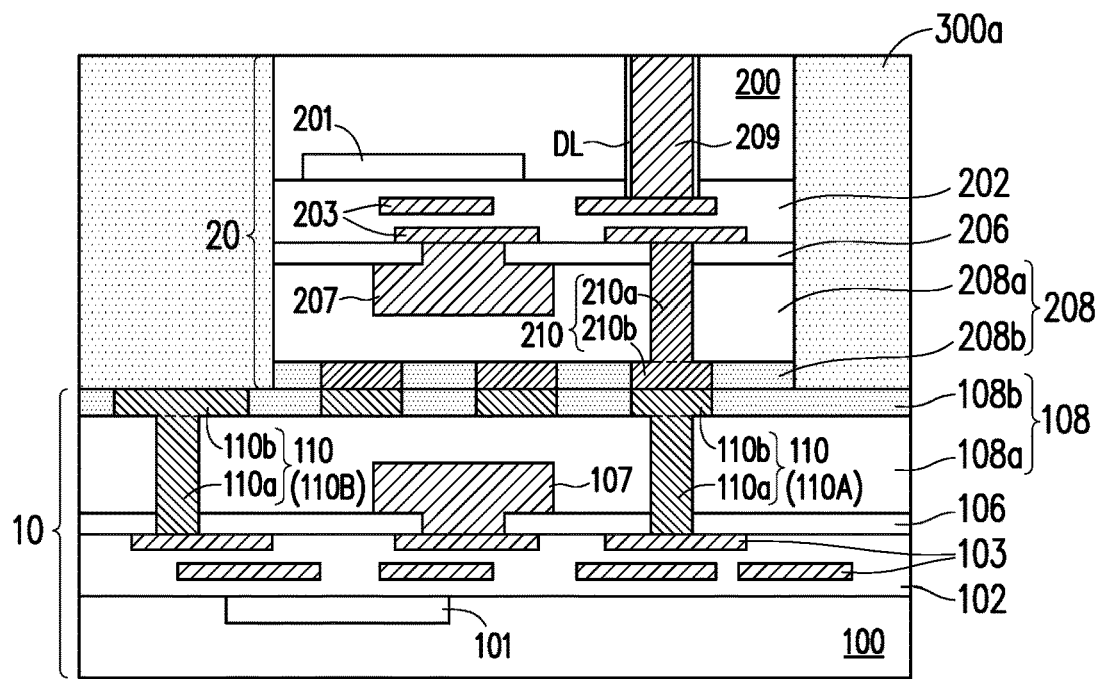

Referring to FIG. 1B and FIG. 1C, a planarization process is performed to remove a portion of the dielectric material layer 300 over the top of the die 20, and a dielectric layer 300a is formed laterally aside the die 20. The planarization process may include a chemical mechanical polishing (CMP) process. In some embodiments in which the conductive via 209 is not revealed in the step of FIG. 1A, the planarization process may further remove a portion of the substrate 200 and the liner DL over the top of the conductive via 209 to reveal the conductive via 209.

Referring to FIG. 1C, the dielectric layer 300a covers a portion of the top surface of the die 10 and the sidewalls of the die 20. In some embodiments, the top surface of the dielectric layer 300a is substantially coplanar with the top surface of the die 20. In an embodiment, the top surface of the dielectric layer 300a is substantially coplanar with the top surface (i.e. back surface) of the substrate 200 and the top surface of the TSV 209 of the die 20. In some embodiments, the dielectric layer 300a may also be referred to as a gap-filling dielectric layer or an insulation structure or a dielectric structure.

Figure 1D:
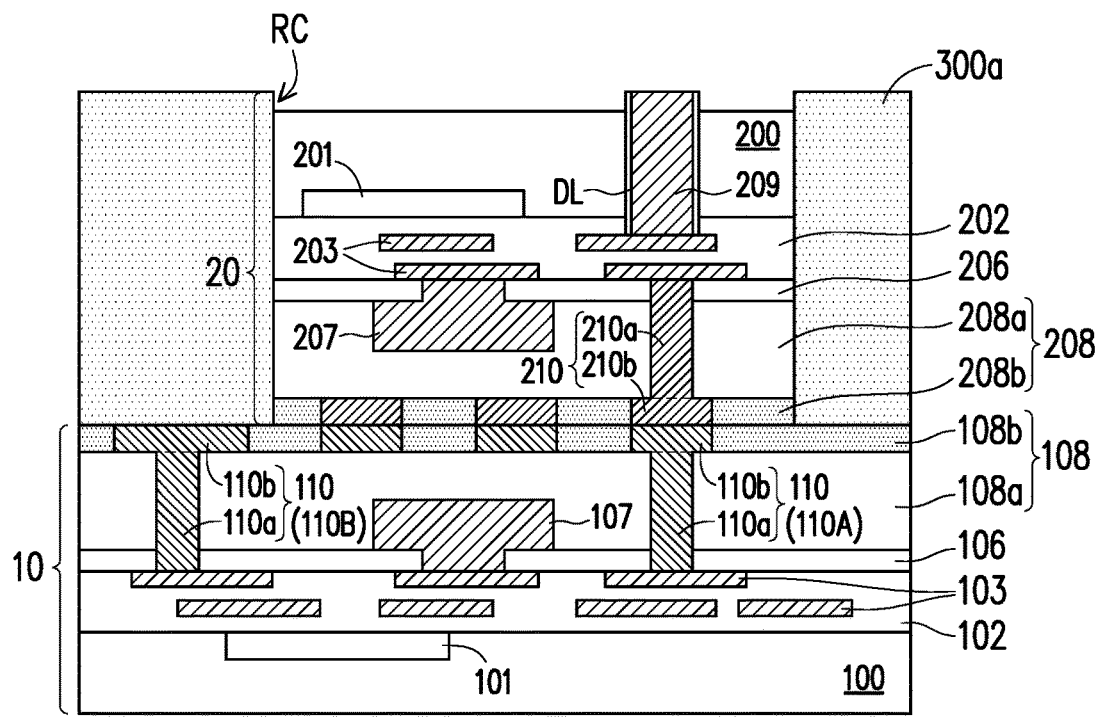

Referring to FIG. 1C and FIG. 1D, in some embodiments, the substrate 200 is recessed such that the TSVs 209 protrudes from the substrate 200, and recesses RC are formed across the substrate 200. In some embodiments, the dielectric layer 300a and TSV 209 (e.g. the liner DL of the TSV 209) define sidewalls of the recess RC. For example, a portion of the substrate 200 laterally aside the TSV 209 may be removed by an etching process, such as wet etching process, dry etching process, or a combination thereof. The etching process may a high etching selectivity ratio between the substrate 200 and other adjacent materials (i.e. the dielectric layer 300, the TSV 209 and its liner DL). In some embodiments, the dielectric layer 300a and the liner DL may be substantially not removed by the etching process, but the disclosure is not limited thereto. In alternative embodiments, a portion of the dielectric layer 300a and/or a portion of the liner DL may also be removed by the etching process.

Still referring to FIG. 1D, after the recessing process is performed, the top surface of the substrate 200 is lower than the top surface of the TSV 209 and the top surface of the dielectric layer 300. In other words, the TSV 209 has a portion protruded from the top surface of the substrate 200.

Figure 1E:
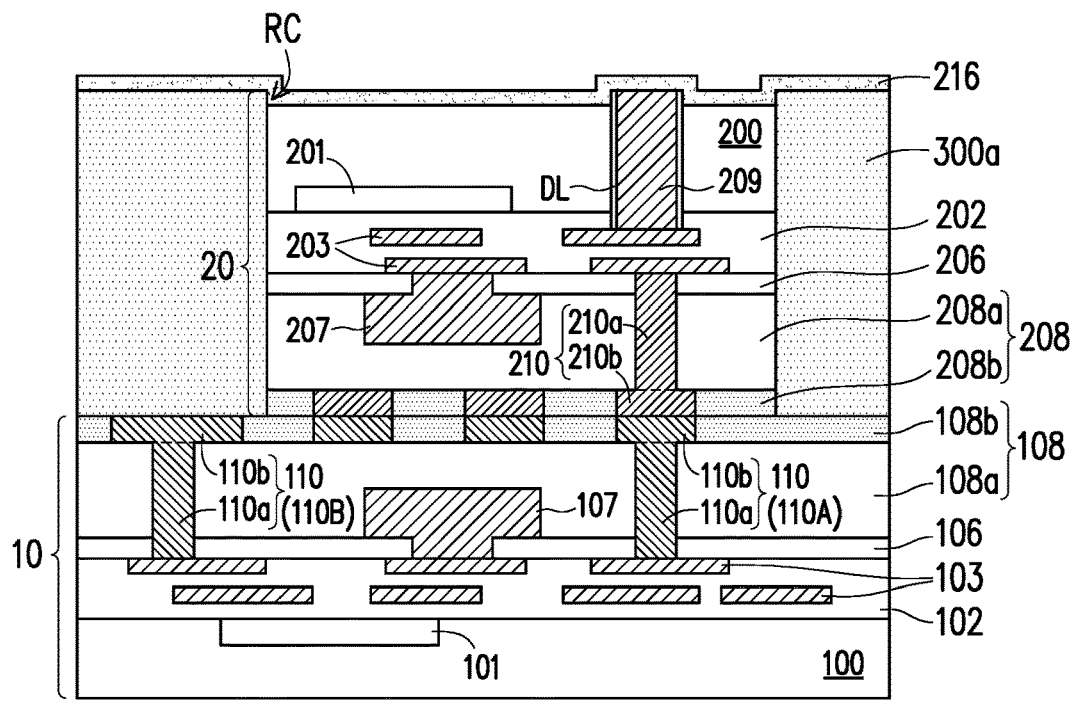

Referring to FIG. 1E, an isolation material layer 216 is formed on die 20 and the dielectric layer 300 to cover the top surfaces of the substrate 200, top surfaces of the TSV 209 and the top surface of the dielectric layer 300a. In some embodiments, the isolation material layer 216 is a conformal layer, that is, the isolation material layer 216 has a substantially equal thickness extending along the region on which the isolation material layer 216 is formed. The isolation material layer 216 may include a dielectric material such as silicon nitride, although other dielectric materials such as silicon oxide, silicon carbide, silicon nitride, silicon oxynitride, oxygen-doped silicon carbide, nitrogen-doped silicon carbide, a polymer, which may be a photo-sensitive material such as PBO, polyimide, or BCB, a low-K dielectric material such as PSG, BPSG, FSG, SiOxCy, SOG, spin-on polymers, silicon carbon material, compounds thereof, composites thereof, combinations thereof, or the like may also be used for the isolation material layer 216. The isolation material layer 216 may be formed using a suitable deposition process, such as CVD, atomic layer deposition (ALD), or the like.

In some embodiments, the isolation material layer 216 is formed to have a thickness at least equal to the height of the recess RC (i.e. the thickness of the portion of the TSV 209 protruded from the substrate 200). In other words, the isolation material layer 216 fully fills the recess RC.

Figure 1F:
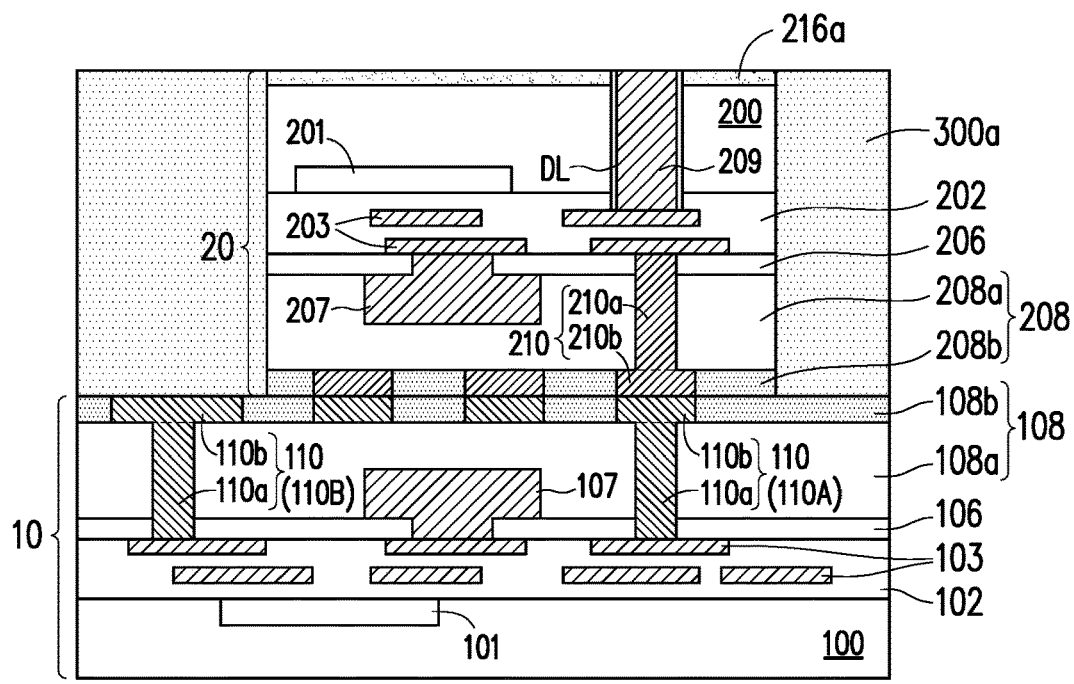

Referring to FIG. 1E and FIG. 1F, a planarization process is performed to remove a portion of the isolation material layer 216a over the top of the TSV 209, so as to reveal the TSV 209, and an isolation layer 216a is formed. The planarization process may include a CMP process.

Referring to FIG. 1F, the isolation layer 216a is located on the substrate 200 and laterally aside the TSV 209. In some embodiments, the isolation layer 216a is laterally between the TSV 209 and the dielectric layer 300a. The top surface of the isolation layer 216a may be substantially coplanar with the top surface of the TSV 209 and the top surface of the dielectric layer 300a. In some other embodiments, the formation of the isolation layer 216a shown in FIG. 1D to FIG. 1F may be omitted. In yet another embodiment, the isolation layer may be formed before forming the dielectric layer 300a, and the isolation layer may be formed extending along the top surface and sidewalls of the die 20 and the top surface of the die 10. In yet alternative embodiment, the isolation layer may further extend to cover the top surface of the dielectric layer 300a.

Figure 1G:
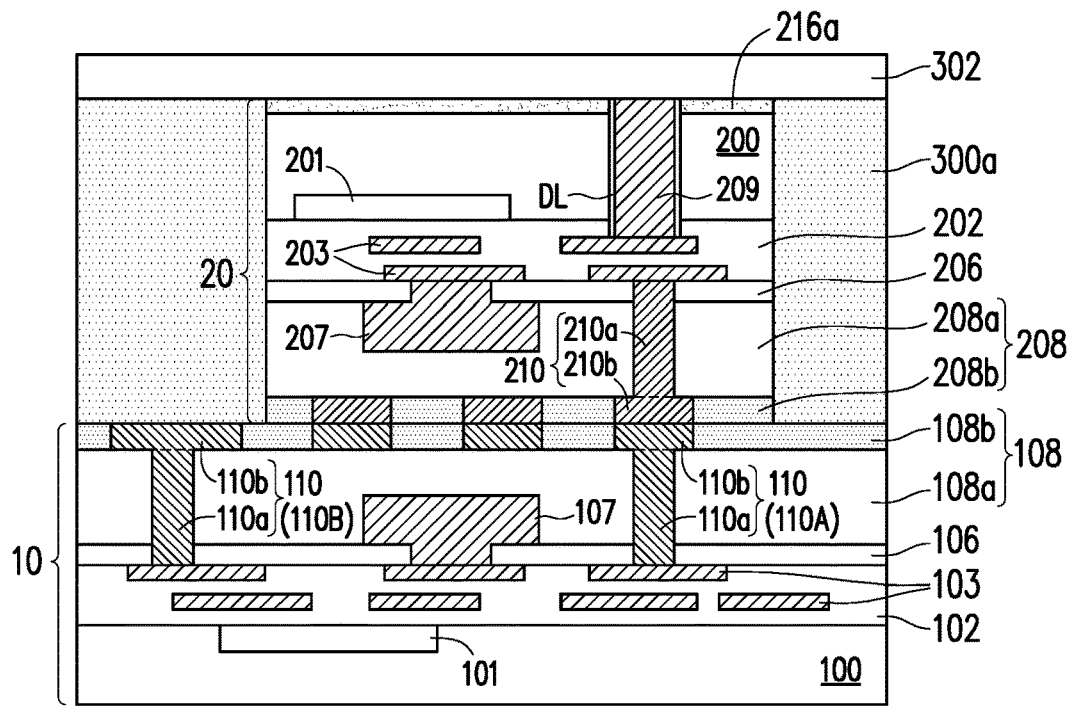

Referring to FIG. 1G, a dielectric layer 302 is formed on the die 20 and the dielectric layer 300a to cover the top surfaces of the die 20 and the dielectric layer 300a. The dielectric layer 302 may include an oxide such as silicon oxide, a nitride such as silicon nitride, USG, or the like, or combinations thereof. The dielectric layer 302 may be formed by a suitable deposition process such as CVD.

FIG. 1H through FIG. 1K illustrates the formation of through dielectric via 310 and redistribution layer 312 according to some embodiments of the disclosure. In some embodiments, the through dielectric via 310 and the redistribution layer 312 are formed through dual-damascene process and are formed after forming the dielectric layer 302.

Figure 1H:
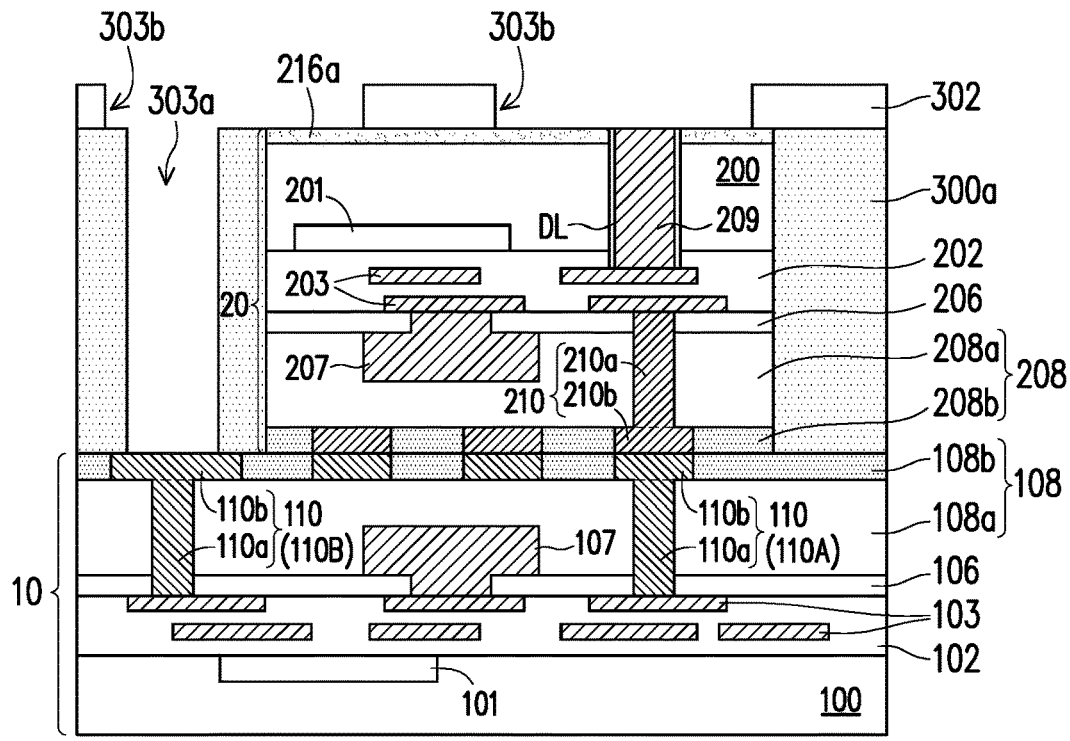

Referring to FIG. 1H, a patterning process is performed to form via hole(s) 303a in the dielectric layer 300a and trench(s) 303b in the dielectric layer 302. The via hole 303a and the trench 303b may be together referred to as a recess or an opening formed in the dielectric layer 302 and the dielectric layer 300a. The patterning process removes a portion of the dielectric layer 302 and a portion of the dielectric layer 300a to expose a top surface of the bonding pad 110b of the bonding conductor 110B of the die 10 and a top surface of the TSV 209 of the die 20. The pattering process may include multiple photolithograph and etching processes.

The via hole 303a penetrates through the dielectric layer 300a to expose a portion of the top surface of the bonding pad 110b of the bonding conductor 110B of the die 10. The trench 303b penetrates through the dielectric layer 302 to be in spatial communication with the via hole 303a and expose a portion of the top surface of the dielectric layer 300a and/or a portion of the top surface of the die 20. In some embodiments, the trench 303b exposes the top surface of the TSV 209 and a portion of the top surface of the isolation layer 216a of the die 20. The sidewalls of the via hole 303a and the trench 303b may be straight or inclined, respectively.

Figure 1I:
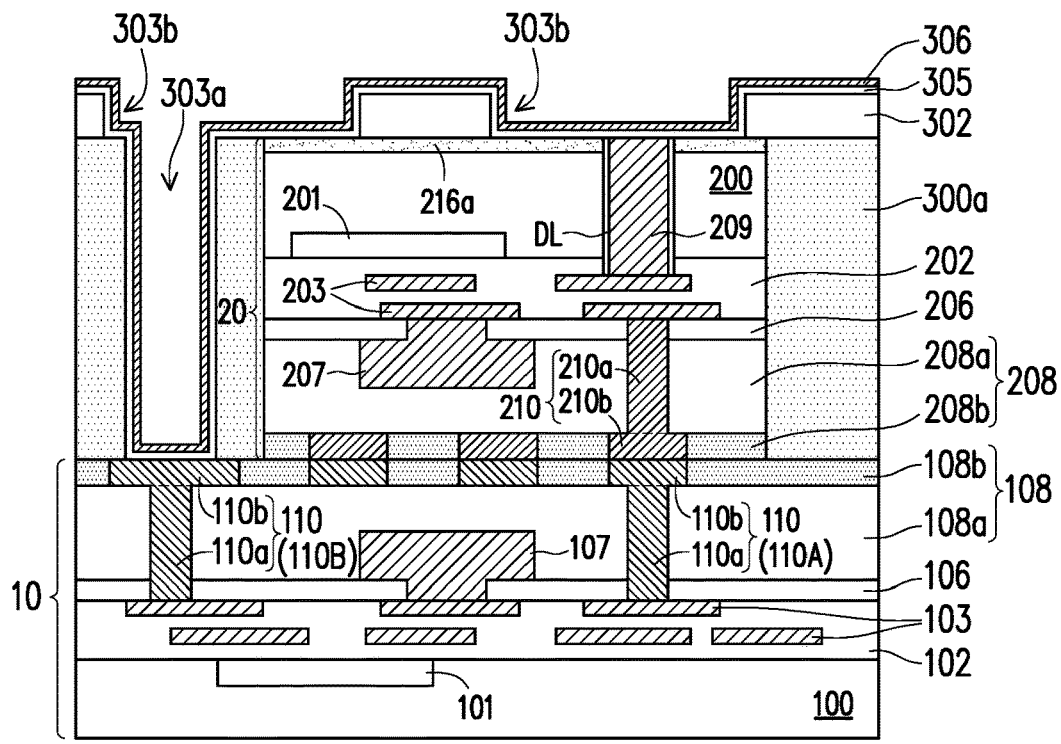

Referring to FIG. 1I, a barrier material layer 305 and a seed material layer 306 are sequentially formed along the surfaces of the via hole 303a and the trench 303b and the top surface of the dielectric layer 302. The barrier material layer 305 may also be referred to as a diffusion barrier layer. In some embodiments, the barrier material layer 305 may include titanium, titanium nitride, tantalum, tantalum nitride, or the like, and may be formed by ALD, CVD, Physical Vapor Deposition (PVD), or the like. The seed material layer 306 may be a metal seed layer such as a copper seed layer. In some embodiments, the seed material layer 306 includes a first metal layer such as a titanium layer and a second metal layer such as a copper layer over the first metal layer. The seed material layer 306 may be formed by a sputtering process, or the like. The seed material layer 306 may be optionally formed and may be omitted in some other embodiments.

In some embodiments, the barrier material layer 305 and the seed material layer 306 fills a portion of the via hole 303a and the trench 303b. The barrier material layer 305 covers (or lines) the surfaces of the via hole 303a and the trench 303b and the top surface of the dielectric layer 302. The seed material layer 306 covers the surfaces of the barrier material layer 305. In some embodiments, the barrier material layer 305 is conformal with the via hole 303a and the trench 303b and the dielectric layer 302, and the seed material layer 306 is conformal with the barrier material layer 305.

Figure 1J:
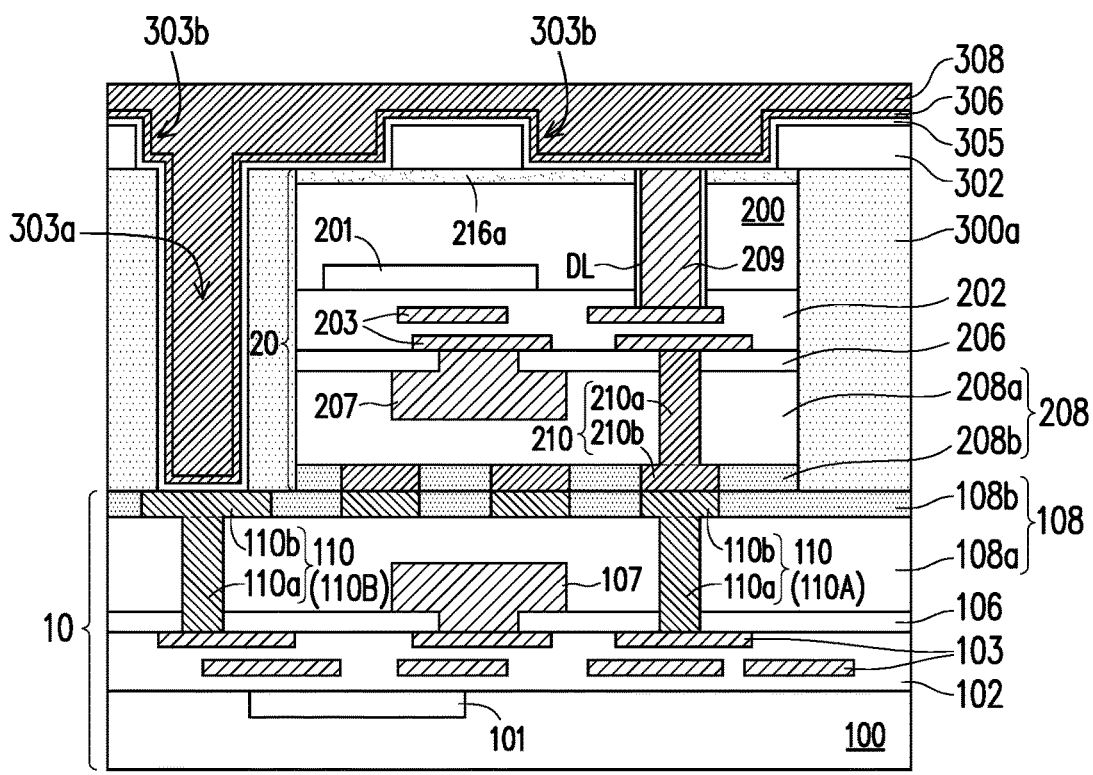

Referring to FIG. 1J, conductive material 308 is formed on the seed material layer 306 to fill the via hole 303a and the trench 303b. The conductive material 308 includes a suitable metallic material, such as copper or copper alloy. The conductive material 308 fills remaining portions of the via hole 303a and the trench 303b not filled by the barrier material layer 305 and the seed material layer 306 and further protrudes from the top surface of the dielectric layer 302. In some embodiments, the forming method of the conductive material 308 may include a plating process such as electroplating process or electro-chemical plating, or a suitable deposition process such as CVD, PVD, or the like.

Figure 1K:
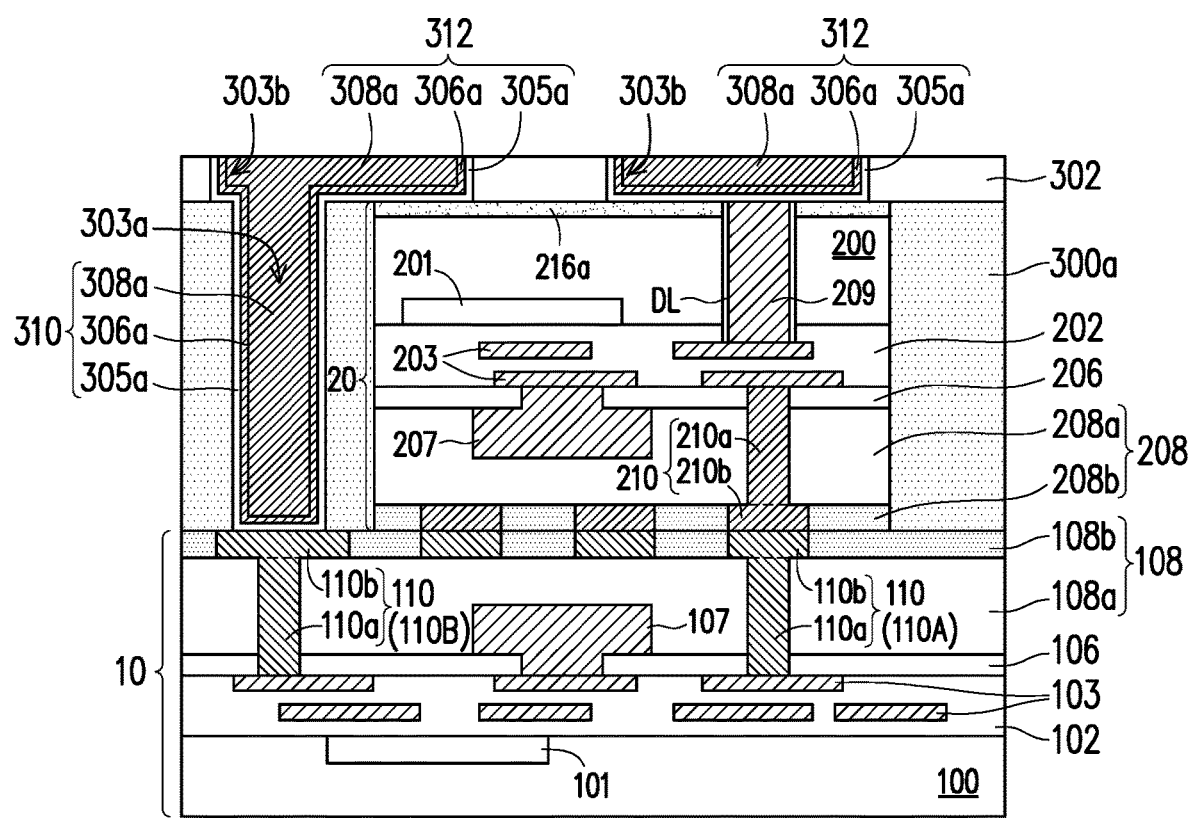
Figure 1L:
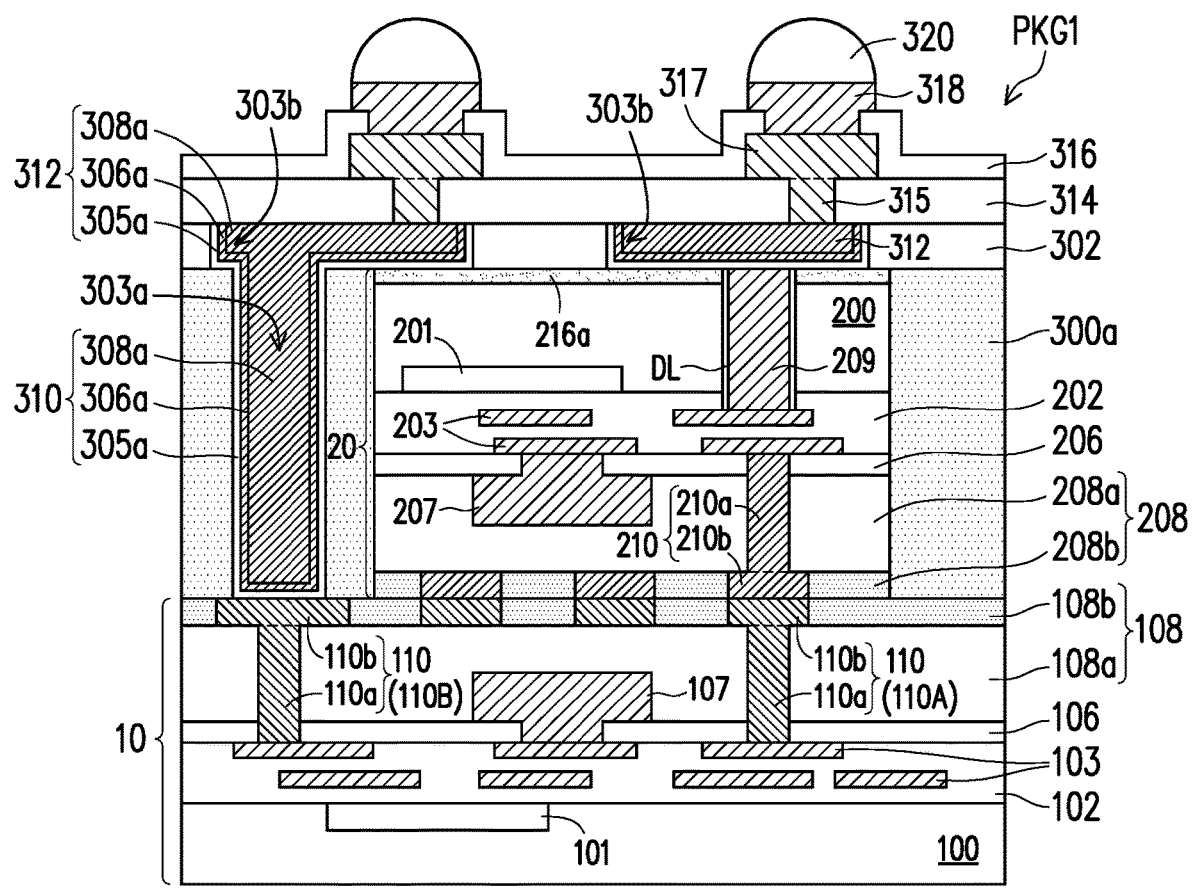

Referring to FIG. 1J and FIG. 1K, thereafter, a planarization process such as a CMP process is performed to remove excess portions of the conductive material 308, the seed material layer 306 and the barrier material layer 305, until the dielectric layer 302 is exposed, and a barrier layer 305a, a seed layer 306a and a conductor 308a are remained in the via hole 303a and the trench 303b. In some embodiments, after the planarization process is performed, the top surfaces of the conductor 308a, the seed layer 306a and the barrier layer 305a are substantially coplanar with the top surface of the dielectric layer 302. The seed layer 306a is sandwiched between and in contact with the barrier layer 305a and the conductor 308a.

As shown in FIG. 1K, the barrier layer 305a extends continuously along surfaces of the dielectric layer 302 and the dielectric layer (insulation structure) 300a. The seed layer 306a and the barrier layer 305a surrounds periphery (sidewalls and bottom surfaces) of the conductor 308a and are not interposed in the conductor 308a. Portions of the barrier layer 305a and portions of the seed layer 306a are laterally between the conductor 308a and the dielectric layer 300a and laterally between the conductor 308a and the dielectric layer 302.

In some embodiments, the conductor 308a, the seed layer 306a and the barrier layer 305a in the via hole 303a constitute a conductive via which may also be referred to as a through via or a through dielectric via (TDV) 310, while the conductor 308a, the seed layer 306a and the barrier layer 305a in the trench 303b constitute a redistribution layer (RDL) 312. In some embodiments, a first portion of the conductor 308a in the via hole 303a may also be referred to as a conductive post, and a second portion of the conductor 308 in the trench 303b may also be referred to as a conductive layer.

The TDV 310 is embedded in and penetrating through the dielectric layer 300a to be in physical and electrical contact with the top surface of the bonding pad 110b of the bonding conductor 110B of the die 10. The RDL 312 is embedded in and penetrating through the dielectric layer 302 to be in electrical and physical contact with the TDV 310 and the TSV 209 of the die 20. The RDL 312 is extending and routing on the top surface of the dielectric layer 300a and the top surface of the die 20. The RDL 312 may include a plurality of trace sections interconnected to each other. In some embodiments, the RDL 312 may also be referred to as traces or conductive lines.

Still referring to FIG. 1K, in the embodiments of the disclosure, the TDV 310 and the RDL 312 are simultaneously formed after the via hole 303a and the trench 303b being formed in the dielectric layers 302 and 300a. Therefore, there is free of interface between the TDV 310 and the RDL 312, and the conductive post (i.e. first portion of the conductor 308a) of the TDV 310 is in direct physical and electrical contact with the conductive layer (i.e. second portion of the conductor 308a) of the RDL 312 without a barrier layer interposed therebetween. As such, the conductivity between the RDL 312 and the TDV 310 is improved.

The barrier layer 305a of the TDV 310 and the barrier layer 305a of the RDL 312 are continuous, and there is free of interface therebetween; the seed layer 306a of the TDV 310 and the seed layer 306a of the RDL 312 are continuous, and there is free of interface therebetween; the conductive post 308a of the TDV 310 and the conductive layer 308a of the RDL 312 are continuous, and there is free of interface therebetween. In other words, the TDV 310 and the RDL 312 share a barrier layer 305a, a seed layer 306a and a conductor 308a. The conductive layer 308a of the RDL 312 is electrically connected to and in physical contact with the conductive post 308a of the TDV 310, and there is free of seed layer or barrier layer (vertically) between the conductive layer 308a of the RDL 312 and the conductive post 308a of the TDV 310.

In some embodiments, the area of the bottom surface of the barrier layer 305a of the RDL 312 (i.e. the area of the bottom surface of the barrier layer 305a in the trench 303b) is less than the area of the bottom surface of the conductor 308a of the RDL 312 (i.e. the area of the bottom surface of the conductor 308a in the trench 303b). In other words, in some embodiments, the area of the orthogonal projection of the barrier layer 305a of the RDL 312 on the plane of the top surfaces of dielectric layer 300a and the die 20 is less than the area of the orthogonal projection of the conductive layer 308a of the RDL 312 on the said plane.

In some embodiments, the barrier layer 305a of the RDL 312 (i.e. the barrier layer 305a in the trench 303b) is not overlapped with the conductive post 308a of the TDV 310 in a direction perpendicular to the top surface of the die 20 or the top surface of the dielectric layer 300a. That is, an area of an orthogonal projection of the barrier layer 305a of the RDL 312 on a top surface of the conductive post 308a of the TDV 310 is zero. Therefore, an area of an orthogonal projection of the barrier layer 305a of the RDL 312 (i.e. the barrier layer 305a in the trench 303b) on the top surface of the TDV 310 is less than an area of an orthogonal projection of the conductive layer 308a of the RDL 312 ((i.e. the conductor 308a in the trench 303b)) on the top surface of the TDV 310.

In some embodiments, the RDL 312 is also electrically connected to the TSV 209 of the die 20. An interface is existed between the RDL 312 and the TSV 209 of the die 20. Portions of the seed layer 306a and the barrier layer 305a are located between the conductor 308a of the RDL 312 and the TSV 209. In other words, the conductive layer 308a of the RDL 312 is separated from the TSV 209 by the seed layer 306a and the barrier layer 305a therebetween.

Figure 4A:
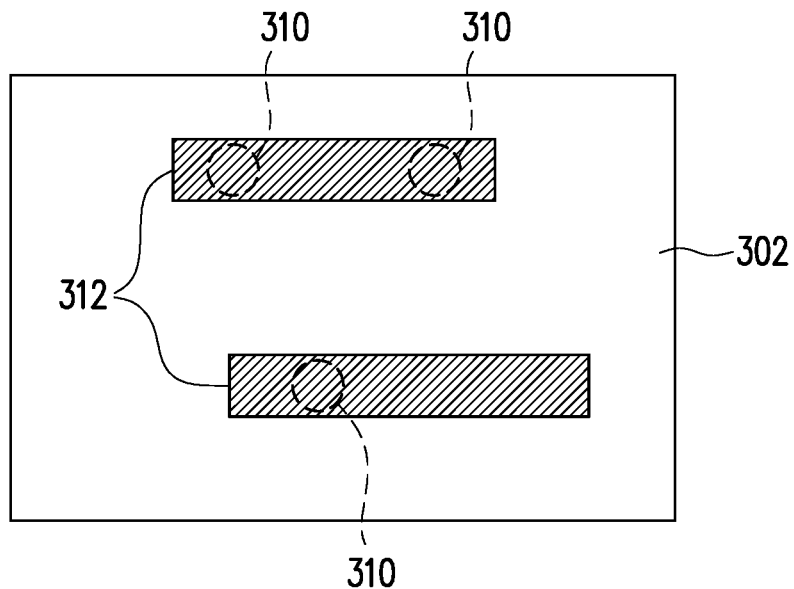
FIG. 4A and FIG. 4B are top views illustrating a through dielectric via and a redistribution layer of a package structure according to some embodiments of the disclosure.
Figure 4B:
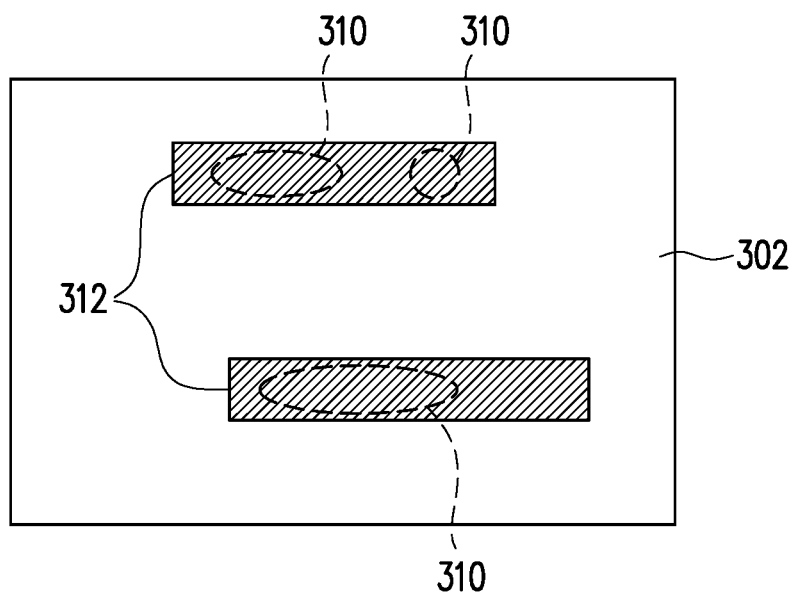

FIG. 4A and FIG. 4B illustrates top views of the RDL 312 and the TDV 310 according to some embodiments of the disclosure.

Referring to FIG. 1K, FIG. 4A and FIG. 4B, in some embodiments, the sidewalls of the TDV 310 and the RDL 312 may be straight or inclined, respectively. The cross-sectional shape of the TDV 310 may be rectangle or tapered. The top view of the TDV 310 may be round, elliptical or the like or any other suitable shaped. The cross-sectional shape of the RDL 312 may be strip shaped, rectangle, trapezoid, or the like, and the top view of the RDL 312 may be strip shaped or the like. Trace sections of the RDL 312 are shown in the top views FIG. 3A and FIG. 3B. It is noted that, although the trace sections of the RDL 312 are not shown to be connected, it should be understood that, they are connected to each other by other routing traces (not shown).

FIG. 1L illustrates the formation of passivation layers, conductive pads, and overlying dielectric layers. Referring to FIG. 1L, in some embodiments, a passivation layer 314 (sometimes referred to as passivation-1) is formed over the dielectric layer 302 and the RDL 312, and vias 315 are formed in the passivation layer 314 to electrically connect to the RDL 312. Conductive pads 317 are formed on the passivation layer 314 and the vias 315, and are electrically coupled to RDLs 312 through the vias 315. The material of the conductive pad 317 and the via 315 may respectively include a suitable metallic material, such as aluminum, copper, alloys thereof, or combinations thereof. In some embodiments, the conductive pads 317 may be aluminum pads or aluminum-copper pads, and other metallic materials may be used. The vias 315 and the conductive pads 317 may be formed separately with an interface therebetween, or formed simultaneously without an interface therebetween.

In some embodiments, a passivation layer 316 (sometimes referred to as passivation-2) is formed over the passivation layer 316 to partially cover the conductive pads 317. The passivation layers 314 and 316 may respectively be a single layer or a composite layer, and may be formed of a non-porous material. In some embodiments, each of the passivation layers 314 and 316 may include silicon oxide, silicon nitride, or a combination thereof. In some embodiments, one or both of passivation layers 314 and 316 is a composite layer including a silicon oxide layer (not shown separately), and a silicon nitride layer (not shown separately) over the silicon oxide layer. The passivation layers 314 and 316 may also be formed of other non-porous dielectric materials such as Un-doped Silicate Glass (USG), silicon oxynitride, and/or the like, or combinations thereof.

In some embodiments, the passivation layer 316 is patterned with a plurality of openings exposing portions of the conductive pads 317. For example, portions of the top surfaces of the conductive pads 317 are exposed by the passivation layer 316 for further connection.

In some embodiments, the structure underlying conductive pads 317 are free from organic materials (such as polymer layers), so that the process for forming the structures underlying conductive pads 317 may adopt the process used for forming device dies, and fine-pitches RDLs (such as 312) having small pitches and line widths are made possible. However, the disclosure is not limited thereto. In some other embodiments, polymer materials may also be used.

In some embodiments, a plurality of conductive patterns 318 are formed on and electrically connected to the conductive pads 317 exposed by the passivation layer 316, and a plurality of conductive terminals 320 are formed on and electrically connected to the conductive patterns 318. In some embodiments, the conductive patterns 318 may be conductive pillars such as copper pillars. The material of the conductive terminal 320 may include copper, aluminum, lead-free alloys (e.g., gold, tin, silver, aluminum, or copper alloys) or lead alloys (e.g., lead-tin alloys). In some embodiments, the conductive terminals 320 may be formed of a Sn—Ag alloy, a Sn—Cu alloy, a Sn—Ag—Cu alloy, or the like, and may be lead-free or lead-containing. The conductive terminal 320 may be formed by a suitable process such as evaporation, plating, ball dropping, screen printing and reflow process, a ball mounting process or the like. In some embodiments, the conductive terminals 320 include solder materials and may also be referred to as solder caps or micro bumps.

In some embodiments, thereafter, a singulation process such as a die saw process may be performed to form a plurality of singulated package structures PKG1, and one of the package structures PKG1 is shown in FIG. 1L. The package structure PKG1 is also referred to as a SoIC package structure. In some embodiments, the package structure PKG1 includes the die 20 and the die 10 bonded to each other, the dielectric layer 300a, the TDV 310, the RDL 312, the dielectric layer 302, the passivation layers 314 and 316, the vias 315, the conductive pads 317 and the conductive terminals 320. The conductive terminal 320 is electrically connected to the dies 10 and 20 through the conductive pattern 318, the conductive pads 317, the RDL 312 and the TDV 310. In the embodiments of the disclosure, the TDV 310 and the RDL 312 are formed simultaneously by dual-damascene process.

Figure 2:
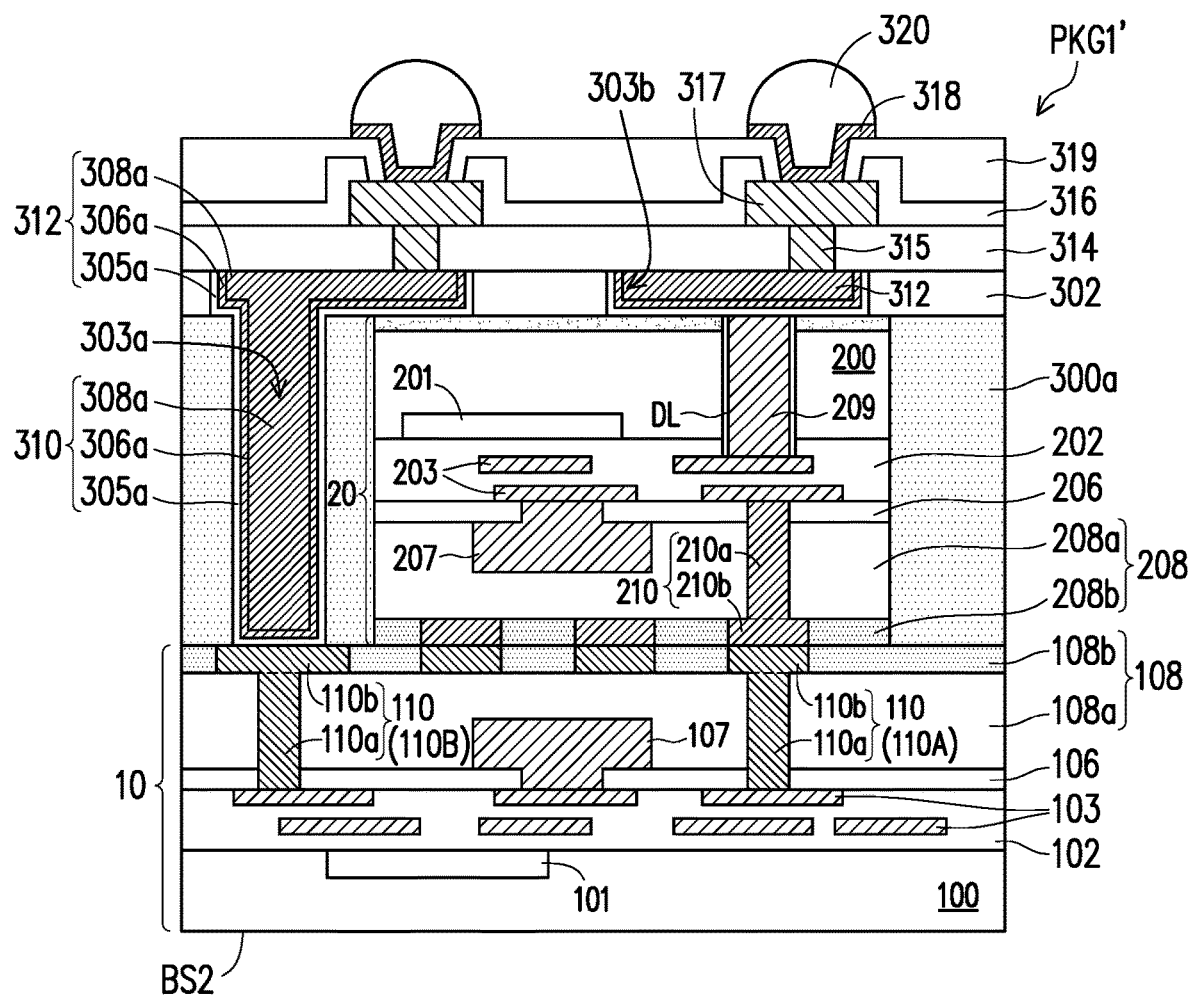
FIG. 2 and FIG. 3 are schematic cross-sectional views illustrating package structures according to some embodiments of the disclosure.

FIG. 2 illustrates a package structure PKG1' according to alternative embodiments of the disclosure. Referring to FIG. 2, in some alternative embodiments, a post-passivation layer 319 may further be formed on the passivation layer 316. The post-passivation layer 319 includes a polymer material such as, polyimide (PI), polybenzoxazole (PBO), benzocyclobutene (BCB) or the like, or combinations thereof. The conductive patterns 318 penetrate through the post-passivation layer 319 and the passivation layer 316 to connect to the conductive pads 317. In such embodiments, the conductive patterns 318 may also be under-bump metallurgies (UBMs), and the conductive terminals 320 may be solder balls, controlled collapse chip connection (C4) bumps, ball grid array (BGA) connectors, or the like.

In some other embodiments, after the passivation layer 316 is formed, more than one polymer layer are formed over the passivation layer 316 and post-passivation interconnects (PPI) (not shown) may be formed in the polymer layer(s) and electrically connected to the conductive pads 317. The post-passivation interconnects include a plurality of conductive vias and traces interconnected to each other, which may also be referred to as RDLs. The conductive patterns 318 and the conductive terminals 320 may be formed over the polymer layers and the post-passivation interconnects to connect to the conductive pads 317.

Figure 3:
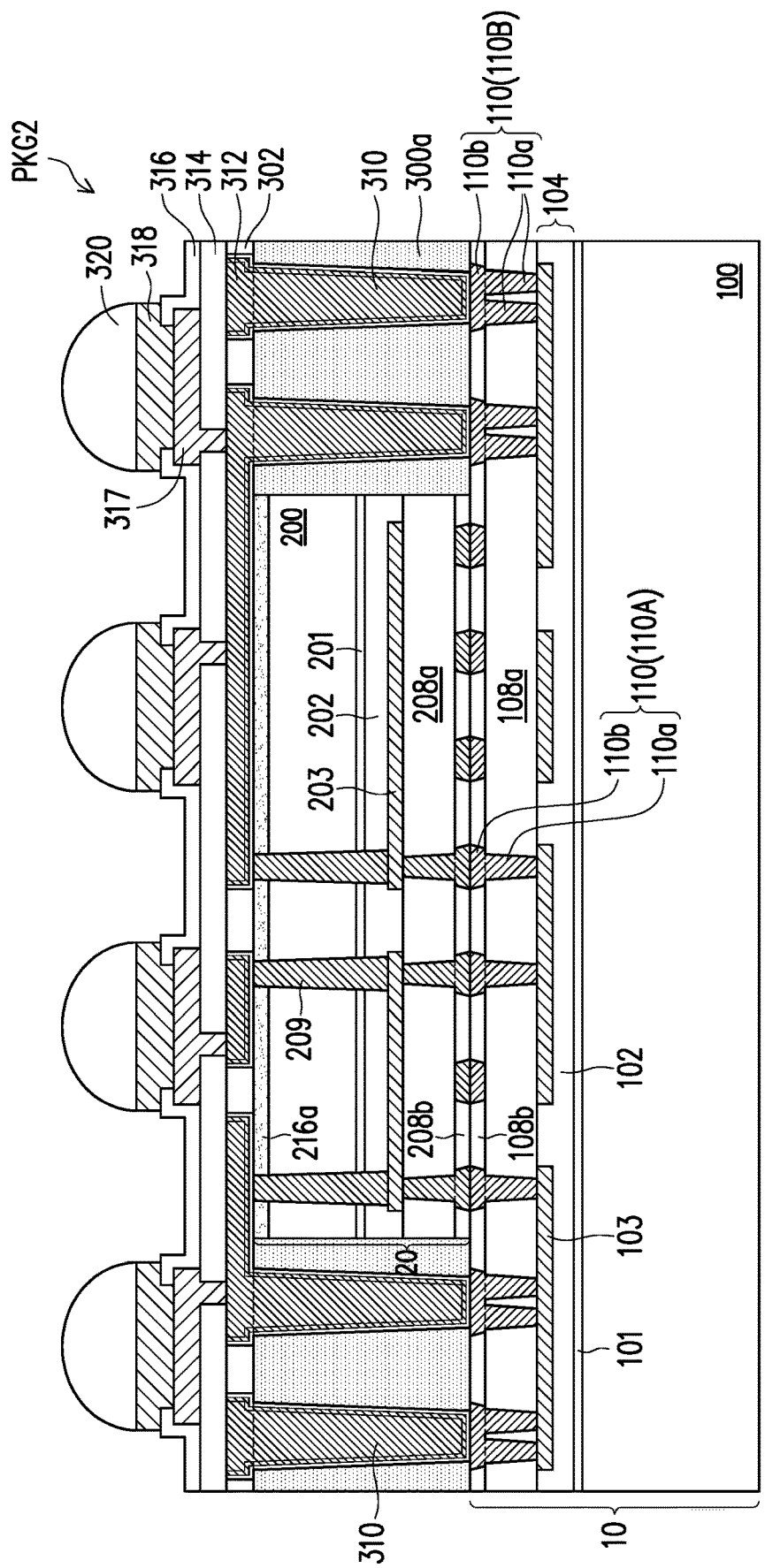

FIG. 3 illustrates a package structure PKG2 according to some other embodiments of the disclosure. The package structure PKG2 is similar to the package structure PKG1, except that more TDVs are shown in the package structure PKG2. It is noted that, some components of the package structure PKG2 are not specifically shown in FIG. 3 for the sake of brevity.

Referring to FIG. 3, in some embodiments, a plurality of TDVs 310 are embedded in the dielectric layer 300a and landing on the bonding pads 110b of the bonding conductor 110B. In some embodiments, the bonding pads 110b may be connected to more than one conductive via 110a. For example, as shown in FIG. 3, the bonding pad 110b may be electrically connected to two conductive vias 110a. The number of the conductive vias 110 corresponding to one bonding pad 110b is not limited in the disclosure. In some embodiments, the TDVs 310 have inclined sidewalls, respectively. For example, the sidewalls of the TDVs 310 may be tapered toward the die 10. The TDVs 310 and the RDL 312 are formed simultaneously and have the same features as those of the package structure PKG1 described above. The other features of the package structure PKG2 may be substantially the same as those of the package structure PKG1, which are not described again here.

In accordance with some embodiments of the disclosure, a package structure includes a first die, a second die, an insulation structure, a through via, a dielectric layer and a redistribution layer. The second die is electrically bonded to the first die. The insulation structure is disposed on the first die and laterally surrounds the second die. The through via penetrates through the insulation structure to electrically connect to the first die. The through via includes a first barrier layer and a conductive post on the first barrier layer. The dielectric layer is on the second die and the insulation structure. The redistribution layer is embedded in the dielectric layer and electrically connected to the through via. The redistribution layer includes a second barrier layer and a conductive layer on the second barrier layer. The conductive layer of the redistribution layer is in contact with the conductive post of the through via.

In accordance with alternative embodiments of the disclosure, a package structure includes a first die, a second die, an insulation structure, a through via, a dielectric layer, and a redistribution layer. The second die is electrically bonded to the first die. The insulation structure is disposed on the first die and laterally surrounds the second die. The through via is laterally aside the second die and embedded in the insulation structure. The dielectric layer is disposed on the second die and the insulation structure. The redistribution layer penetrates through the dielectric layer to connect to the through via. The through via and the redistribution layer share a barrier layer and a conductor over the barrier layer.

In accordance with some embodiments of the disclosure, a method of manufacturing a package structure includes the following processes. A second die is bonded to a first die. An insulation structure is formed on the first die and laterally aside the second die. A dielectric layer is formed on the second die and the insulation structure. A through via is formed to penetrate through the insulation structure to electrically connect to the first die. A redistribution layer is formed to be embedded in dielectric layer and electrically connected to the through via. The through via is formed after forming the dielectric layer.

In accordance with some embodiments of the disclosure, a package structure includes a first die, a second die, an insulation structure, a through via, a dielectric layer and a redistribution layer. The second die is electrically bonded to the first die and includes a through substrate via. The insulation structure is disposed on the first die and laterally surrounds the second die. The through via penetrates through the insulation structure to electrically connect to the first die. The dielectric layer is disposed on the second die and the insulation structure. The redistribution layer is embedded in the dielectric layer and electrically connected to the through via, wherein the redistribution layer comprises a first barrier layer and a conductive layer on the first barrier layer. The conductive layer of the redistribution layer is in contact with a conductive post of the through via, the through substrate via is electrically connected to the redistribution layer, and the conductive layer of the redistribution layer is separated from the through substrate via by the first barrier layer therebetween.

In accordance with alternative embodiments of the disclosure, a package structure includes a first die, a second die, an insulation structure, a through via, a dielectric layer, and a redistribution layer. The second die is electrically bonded to the first die and includes a through substrate via. The insulation structure is disposed on the first die and laterally surrounds the second die. The through via is laterally aside the second die and embedded in the insulation structure. The dielectric layer is disposed on the second die and the insulation structure. The redistribution layer penetrates through the dielectric layer to connect to the through via. A portion of the redistribution layer is located on and electrically connected to the through substrate via of the second die, and there is an interface between the redistribution layer and the through substrate via.

In accordance with some embodiments of the disclosure, a method of manufacturing a package structure includes the following processes. A second die is bonded to a first die, and the second die includes a through substrate via. An insulation structure is formed on the first die and laterally aside the second die. A dielectric layer is formed on the second die and the insulation structure. A through via is formed to penetrate through the insulation structure to electrically connect to the first die. A redistribution layer is formed to be embedded in dielectric layer and electrically connected to the through via. A portion of the redistribution layer is located on and electrically connected to the through substrate via of the second die, and there is an interface between the redistribution layer and the through substrate via.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a first die;
   a second die, electrically bonded to the first die and comprising a through substrate via;
   an insulation structure, disposed on the first die and laterally surrounding the second die;
   a through via, penetrating through the insulation structure to electrically connect to the first die;
   a dielectric layer on the second die and the insulation structure; and
   a redistribution layer, embedded in the dielectric layer and electrically connected to the through via, wherein the redistribution layer comprises a first barrier layer and a conductive layer on the first barrier layer,
   wherein the conductive layer of the redistribution layer is in contact with a conductive post of the through via, the through substrate via is electrically connected to the redistribution layer, and the conductive layer of the redistribution layer is separated from the through substrate via by the first barrier layer therebetween, and there is no interface between the conductive post and the conductive layer.

2. The package structure of claim 1, wherein there is no barrier layer between the conductive layer of the redistribution layer and the conductive post of the through via.

3. A package structure, comprising:
   a first die;
   a second die electrically bonded to the first die, comprising a through substrate via;
   an insulation structure, disposed on the first die and laterally surrounding the second die;
   a through via, laterally aside the second die and embedded in the insulation structure;
   a dielectric layer, disposed on the second die and the insulation structure; and
   a redistribution layer, penetrating through the dielectric layer to connect to the through via,
   wherein a portion of the redistribution layer is located on and electrically connected to the through substrate via of the second die, and there is an interface between the redistribution layer and the through substrate via, and
   the through via and the redistribution layer share a barrier layer and a conductor over the barrier layer, the conductor comprises a conductive post embedded in the insulation structure and a conductive layer embedded in the dielectric layer, and the barrier layer surrounds a periphery of the conductor without being interposed therein.

4. The package structure of claim 3, wherein the through via and the redistribution layer further share a seed layer, and the seed layer is sandwiched between the barrier layer and the conductor.

5. The package structure of claim 1, wherein sidewalls of the conductive layer are laterally surrounded by the first barrier layer.

6. The package structure of claim 1, wherein the first barrier layer of the redistribution layer and a second barrier layer of the through via are continuous, and there is no interface between the first barrier layer and the second barrier layer.

7. The package structure of claim 6, wherein
   the through via further comprises a first seed layer sandwiched between the second barrier layer and the conductive post;
   the redistribution layer further comprises a second seed layer sandwiched between the first barrier layer and the conductive layer.

8. The package structure of claim 7, wherein the first seed layer and the second seed layer are continuous, and there is no interface between the first seed layer and the second seed layer.

9. The package structure of claim 1, wherein the through substrate via comprises a conductive via and a dielectric liner that is disposed between the conductive via and a substrate of the second die.

10. The package structure of claim 3, wherein a portion of the barrier layer is laterally between the conductor and the dielectric layer.

11. The package structure of claim 3, wherein the conductor of the portion of the redistribution layer is separated from the through substrate via by the barrier layer therebetween.

12. The package structure of claim 3, wherein the barrier layer extends continuously along surfaces of the dielectric layer and the insulation structure.

13. The package structure of claim 3, wherein a hybrid bonding interface between the second die and the first die comprises a metal-to-metal bonding interface and a dielectric-to-dielectric bonding interface.

14. A package structure, comprising:
   a first integrated circuit;
   a second integrated circuit, electrically bonded to the first integrated circuit and comprising a through substrate via;
   a through via, disposed aside the second integrated circuit and electrically connect to the first integrated circuit; and
   a redistribution layer, electrically connected to the through substrate via and the through via, wherein the redistribution layer comprises a first barrier layer and a conductive layer on the first barrier layer, and the conductive layer of the redistribution layer is separated from the through substrate via by the first barrier layer therebetween, and there is no barrier layer between the conductive layer of the redistribution layer and a conductive post of the through via.

15. The package structure of claim 14, wherein sidewalls of the conductive layer are laterally surrounded by the first barrier layer.

16. The package structure of claim 14, wherein there is no interface between the conductive post of the through via and the conductive layer.

17. The package structure of claim 14, wherein the first barrier layer of the redistribution layer and a second barrier layer of the through via are continuous, and there is no interface between the first barrier layer and the second barrier layer.

18. The package structure of claim 14, wherein the redistribution layer further comprises a seed layer between the first barrier layer and the conductive layer.

19. The package structure of claim 14, further comprising a first dielectric layer encapsulating the conductive post of the through via and the second integrated circuit and a second dielectric layer encapsulating the conductive layer of the redistribution layer.

20. The package structure of claim 14, wherein the through substrate via penetrates through a substrate and an isolation layer.

\* \* \* \* \*